United States Patent
Kang et al.

(10) Patent No.: US 12,411,258 B2
(45) Date of Patent: Sep. 9, 2025

(54) DEVICE AND PROCESSING METHOD FOR OFFSETTING ATTITUDE ERROR OF SEMI-AIRBORNE ELECTROMAGNETIC SYSTEM

(71) Applicant: Institute of Geology and Geophysics, Chinese Academy of Sciences, Beijing (CN)

(72) Inventors: Lili Kang, Beijing (CN); Zhongxing Wang, Beijing (CN); Zhiyao Liu, Beijing (CN); Tianxin Zhang, Beijing (CN)

(73) Assignee: Institute of Geology and Geophysics, Chinese Academy of Sciences, Beijing (CN)

( * ) Notice: Subject to any disclaimer, the term of this patent is extended or adjusted under 35 U.S.C. 154(b) by 162 days.

(21) Appl. No.: 18/480,269

(22) Filed: Oct. 3, 2023

(65) Prior Publication Data
US 2024/0159933 A1 May 16, 2024

Related U.S. Application Data

(63) Continuation of application No. PCT/CN2022/141932, filed on Dec. 26, 2022.

(30) Foreign Application Priority Data

Nov. 11, 2022 (CN) .......................... 202211411489.2

(51) Int. Cl.
*G01V 3/16* (2006.01)
*G01V 3/10* (2006.01)
*G01V 3/17* (2006.01)

(52) U.S. Cl.
CPC ................ *G01V 3/16* (2013.01); *G01V 3/104* (2013.01); *G01V 3/17* (2013.01)

(58) Field of Classification Search
CPC ... G01V 3/10; G01V 3/12; G01V 3/16; G01V 3/165; G01V 3/17; G01V 3/38; G01R 33/0017

See application file for complete search history.

(56) References Cited

U.S. PATENT DOCUMENTS 8,878,538 B2 * 11/2014 Kuzmin .................. G01V 3/17
324/331
2010/0237870 A1    9/2010 Dodds
(Continued)

FOREIGN PATENT DOCUMENTS

CA          2931211 A1    11/2016
CN        104019812 A      9/2014
(Continued)

OTHER PUBLICATIONS

International Search Report and Written Opinion for PCT/CN2022/141932, mailed Jul. 24, 2023.

*Primary Examiner* — Steven L Yeninas
(74) *Attorney, Agent, or Firm* — Pilloff Passino & Cosenza LLP; Rachel K. Pilloff; Sean A. Passino

(57) ABSTRACT

A device and a processing method for offsetting an attitude error of a semi-airborne electromagnetic system. The method includes following steps: adjusting attitude angles of the adjustable offset coil based on the changing attitude angle of the measuring coil; obtaining a magnetic induction intensity of offset coils based on the offset coil pairs after an attitude angle adjustment; performing a calculation based on the magnetic induction intensity of the offset coils to obtain attitude error data of the measuring coil; obtaining a magnetic induction intensity of the measuring coil with an attitude error offset based on the magnetic induction intensity and the attitude error data of the measuring coil.

8 Claims, 6 Drawing Sheets

(56) References Cited

U.S. PATENT DOCUMENTS

| | | | |
|---|---|---|---|
| 2011/0115489 A1* | 5/2011 | Morrison | G01V 3/165 |
| | | | 324/330 |
| 2017/0068013 A1 | 3/2017 | Cho et al. | |
| 2018/0044019 A1* | 2/2018 | Morrison | G01V 3/165 |

FOREIGN PATENT DOCUMENTS

| | | |
|---|---|---|
| CN | 114779358 A | 7/2022 |
| CN | 115201922 A | 10/2022 |

\* cited by examiner

DEVICE AND PROCESSING METHOD FOR OFFSETTING ATTITUDE ERROR OF SEMI-AIRBORNE ELECTROMAGNETIC SYSTEM

CROSS-REFERENCE TO RELATED APPLICATIONS

This application is a continuation of PCT/CN2022/141932, filed on Dec. 26, 2022, and claims priority of Chinese Patent Application No. 202211411489.2, filed on Nov. 11, 2022, the entire contents of which are incorporated herein by reference.

TECHNICAL FIELD

The disclosure relates to a technical field of magnetic field measurement, and in particular to a device and a processing method for offsetting an attitude error of a semi-airborne electromagnetic system.

BACKGROUND

A semi-airborne electromagnetic detection method may be applicable to detecting complex terrain areas, and has the advantage of large depth and rapid detection. However, because the signal of the measured vertical magnetic field component is weak and decays rapidly with the growing transmitting-receiving distance, the signal-to-noise ratio of the system is low, thus limiting the effective detection depth and the detection range of the system. Therefore, it is very important to improve the signal-to-noise ratio of the system, so as to improve the detection depth and accuracy of the system, and one of the key technologies is to reduce the noise level of the receiving system as much as possible.

The main noise source of the semi-airborne electromagnetic detection system is the motion noise introduced into the receiving coil during the movement measurement of the receiving system. The attitude change during the movement of the coil leads to the change of the equivalent receiving area of the coil in the direction of the measured magnetic field, and a horizontal magnetic field component much larger than the measured vertical magnetic field component is introduced, so that the attitude error is introduced. Aiming at the attitude error, in the attitude correction methods of aviation frequency domain electromagnetic detection data in the prior art, an attitude correction method based on "iterative calculation of apparent resistivity with three-axis attitude" is proposed, so that the attitude error is corrected to some extent. However, this method is based on an assumption that the response magnetic field changes monotonically with resistivity after attitude deflection in one-dimensional geoelectric model, and the attitude error correction effect of three-dimensional anomaly detection data is unclear, and the problem of magnetic field attitude error of the semi-airborne system cannot be fundamentally solved. Therefore, there are following technical problems in the prior art:

1. The existing motion noise removal methods generally deal with noises from time domain systems or with specific sources, but cannot do anything about the same frequency motion noise (the detection frequency is the same frequency as the attitude error) in the semi-airborne electromagnetic system; and 2. The attitude error correction effect of the existing attitude error correction methods for the three-dimensional anomaly detection data is unclear, and the problem of magnetic field attitude error of the semi-airborne system cannot be fundamentally solved.

SUMMARY

In order to solve the problems existing in the prior art, the disclosure provides a device and a processing method for offsetting an attitude error of a semi-airborne electromagnetic system, so as to reduce the influence of the attitude error of the system and improve the accuracy of magnetic field measurement.

In order to achieve the above technical objectives, the disclosure provides a following technical scheme: a device for offsetting an attitude error of a semi-airborne electromagnetic system, including:

a measuring coil, offset coils, a logic control unit and attitude adjustment devices;

where the offset coils are arranged in different directions of the measuring coil, and the offset coils symmetrically arranged in same directions are offset coil pairs, the offset coil pair consists of an adjustable offset coil and a fixed offset coil, the attitude adjusting devices are connected with the adjustable offset coils and sleeved on the measuring coil with the adjustable offset coils, and the fixed offset coils are fixed on the measuring coil; and the logic control unit is connected with the attitude adjustment devices and is used for controlling the attitude adjustment devices to adjust the attitude of the adjustable offset coils.

Optionally, the attitude adjustment devices adopt micro motors, where the micro motors are insulated and fixed on the measuring coil and arranged at centers of the adjustable offset coils.

Optionally, the measuring coil and the offset coils are axisymmetric coils.

In order to better achieve the above technical objectives, the disclosure also provides a processing method for offsetting an attitude error of a semi-airborne electromagnetic system, and the processing method includes following steps:

S1, obtaining a magnetic induction intensity and changing attitude angles of the measuring coil;

S2, adjusting attitude angles of the adjustable offset coils based on the changing attitude angles of the measuring coil; obtaining a magnetic induction intensity of the offset coils based on the offset coil pairs after an attitude angle adjustment; performing a calculation based on the magnetic induction intensity of the offset coils to obtain attitude error data of the measuring coil; obtaining a magnetic induction intensity of the measuring coil with an attitude error offset based on the magnetic induction intensity and the attitude error data of the measuring coil.

Optionally, a process of obtaining the changing attitude angles of the measuring coil includes:

constructing an initial coordinate system when the measuring coil is completely horizontal; in an attitude changing process of the measuring coil, constructing a rotating coordinate system in real time, and calculating the changing attitude angles of the measuring coil in different directions according to the initial coordinate system and the rotating coordinate system, where the changing attitude angles of the measuring coil include a yaw angle, a pitch angle and a roll angle.

Optionally, the obtained magnetic induction intensity $B_r$ of the measuring coil is:

$$B_r = R \cdot [B_x, B_y, B_z]^T \cdot [0,0,1]^T = B_x(c\varphi_Y s\varphi_P c\varphi_R + s\varphi_Y s\varphi_R) + B_y(s\varphi_Y s\varphi_P c\varphi_R - c\varphi_Y s\varphi_R) + B_z c\varphi_R c\varphi_P = \Delta B_r + B_z c\varphi_R c\varphi_P$$

where R represents an integral rotation matrix, $B_x$ represents a real magnetic induction intensity in the x direction, $B_y$ represents a real magnetic induction intensity in the y direction, $B_z$ represents a real magnetic induction intensity in the z direction, c represents a cosine function cos, s represents a sine function sin, $\varphi_Y$ represents the yaw angle; $\varphi_P$ represents the pitch angle; $\varphi_R$ represents the roll angle and $\Delta B_r$ represents the attitude error data.

Optionally, a process of adjusting the attitude angles of the adjustable offset coils includes:

adjusting the attitude angles of the offset coils based on the changing attitude angles of the measuring coil, where when an orientation of the offset coil pair is in the x direction, adjusting the pitch angle of the adjustable offset coil by the attitude adjusting device, and in the adjustment process, the pitch angle of the adjustable offset coil and the pitch angle of the measuring coil have same absolute values and opposite directions, the pitch angle of the fixed offset coil and the pitch angle of the measuring coil have same absolute values and same directions; and when the orientation of the offset coil pair is in the y direction, adjusting the roll angle of the adjustable offset coil, and in the adjustment process, the roll angle of the adjustable offset coil and the roll angle of the measuring coil have same absolute values and opposite directions, the roll angle of the fixed offset coil and the roll angle of the measuring coil have same absolute values and same directions.

Optionally, a process of calculating the attitude error data $\Delta B_r$ is:

$$\Delta B_r = \frac{\Delta B_{r1} + \Delta B_{r2}}{2};$$

where $\Delta B_{r1}$ represents a measured magnetic induction intensity deviation of the offset coil pair in the x direction, and $\Delta B_{r2}$ represents a measured magnetic induction intensity deviation of the offset coil pair in the y direction.

The disclosure has following technical effects:

Aiming at the attitude error problem of a single-component semi-airborne electromagnetic detection system, the disclosure provides a method and a device for offsetting the attitude error of the semi-airborne electromagnetic detection system based on symmetrical offset coil pairs. The attitude error caused by the deflection of the coil motion in the system is measured by using a single-degree-of-freedom symmetrical deflection offset coil pair synchronized with the measuring coil, and is removed by combining with an offset algorithm, thus reducing the influence of the attitude error of the system, increasing the signal-to-noise ratio of the measured vertical magnetic field component, improving the detection accuracy of the system and expanding the effective detection depth and range of the system.

BRIEF DESCRIPTION OF THE DRAWINGS

In order to explain an embodiment of the present disclosure or the technical scheme in the prior art more clearly, the drawings needed in the embodiments are briefly introduced below. Obviously, the drawings in the following description are only some embodiments of the present disclosure. For ordinary people in the field, other drawings may be obtained according to these drawings without paying creative labor.

DETAILED DESCRIPTION OF THE EMBODIMENTS

Figure 1:
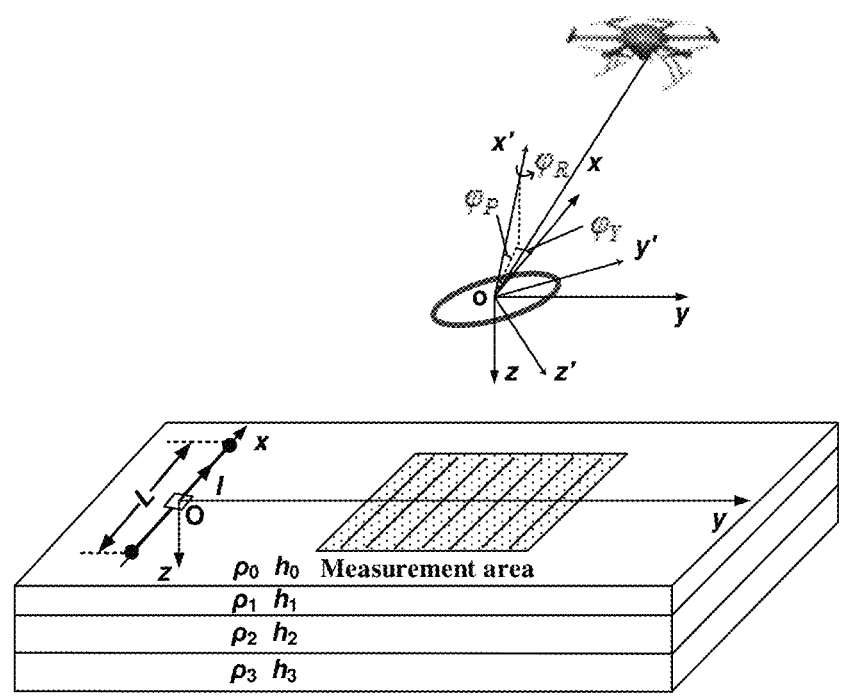
FIG. 1 is a schematic working diagram of a semi-airborne electromagnetic detection system provided by an embodiment of the present disclosure.

In the following, the technical scheme in the embodiment of the disclosure are clearly and completely described with reference to the attached drawings. Obviously, the described embodiment is only a part of the embodiment of the disclosure, but not the whole embodiment. Based on the embodiment in the present disclosure, all other embodiments obtained by ordinary technicians in the field without creative labor belong to the scope of protection of the present disclosure.

The disclosure provides a following technical scheme: a device for offsetting an attitude error of a semi-airborne electromagnetic system, including:

a measuring coil 1, a plurality of offset coils, a logic control unit and a plurality of attitude adjusting devices;

where the plurality of offset coils are arranged in different directions of the measuring coil 1, and the offset coils symmetrically arranged in the same direction are an offset coil pair, where the offset coil pair consists of an adjustable offset coil and a fixed offset coil, where the attitude adjustment devices are connected with the adjustable offset coils, two ends of the adjustable offset coils are sleeved on the measuring coil 1, motors are fixed on the measuring coil 1 for the attitude adjustment of the offset coils, and the fixed offset coils are fixed on the measuring coil 1, so that the fixed coil may be adjusted along with the adjustment of the measuring coil 1, that is, the same direction and angle are adjusted with the measuring coil 1 in the adjustment process; the logic control unit is connected with the attitude adjusting devices for controlling the attitude adjusting devices to adjust the attitude of the adjustable offset coils. A mounting device 6 is fixed on an unmanned aerial vehicle (UAV), and the measuring coil 1 is connected with carrying lines 7, so that the measuring coil 1 is carried on the UAV, and the logic control unit is carried on the same UAV, and the attitude adjustment devices are connected in a wired or wireless way to control the attitude of the adjustable offset coils.

The offset coil includes a first offset coil 2, a second offset coil 3, a third offset coil 4 and a fourth offset coil 5, where the first offset coil 2 and the second offset coil 3 are a set of coil pair, where the first offset coil 2 is the fixed offset coil, and the second offset coil 3 is the adjustable offset coil; the third offset coil 4 and the fourth offset coil 5 are a set of coil pair, where the third offset coil 4 is the fixed offset coil and the fourth offset coil 5 is the adjustable offset coil.

The adjustable offset coils are sleeved in the measuring coil 1 through insulating sleeves, and are controlled to rotate through motor driving, thereby changing attitude angles of the offset coils connected with the attitude adjusting devices.

The attitude adjustment devices adopt micro-motors, where in the micro-motors, a first motor 8 and the second offset coil 3 are fixed by a first fixing rod 9 to adjust the second offset coil 3, and a second motor 10 and the fourth offset coil 5 are fixed by a second fixing rod 11 to adjust the fourth offset coil 5, where the micro-motor is insulated and fixed on the measuring coil, and the motor operation is controlled by the logic control unit, the logic control unit is connected with three-axis sensors. The three-axis sensors are arranged on the above coils to collect three-axis attitude data of different coils in real time and transmit the corresponding three-axis attitude data to the logic control unit. Based on the attitude data of the measuring coil 1, the logic control unit judges a changing attitude angle in the xy axis direction of the measuring coil 1, and when the changing attitude angle of the measuring coil 1 changes, the attitude angles of the adjustable offset coils are adjusted according to the attitude angle of the measuring coil 1, and specific control signals are generated to control the motors to adjust the offset coils to the above attitude angles.

Taking the offset coil pair in the x direction as an example, roll angles and yaw angles of two offset coils in the offset coil pair are completely consistent with roll angles and yaw angles of the measuring coil 1, but the pitch angle of the offset coil to be adjusted has a same absolute value with the pitch angle of the measuring coil 1, and has an opposite direction with the pitch angle of the measuring coil 1, and the other offset coil fixed in the measuring coil 1 is adjusted with the measuring coil, that is, the three-axis attitude angles of the measuring coil 1 and the first offset coil 2 are ($\varphi_R$, $\varphi_P$, $\varphi_Y$), the three-axis attitude angle of the second offset coil 3 is ($\varphi_R$, $-\varphi_P$, $\varphi_Y$). The offset coil pair in the y direction is similar. Pitch angles and yaw angles of the two offset coils in the offset coil pair are completely consistent with pitch angles and yaw angles of the measuring coil 1, and the roll angles of the two offset coils have a same absolute value with the roll angle of the measuring coil 1, but have an opposite direction with the roll angle of the adjustable offset coil. The other fixed offset coil fixed on the measuring coil 1 is adjusted with the measuring coil 1, that is, the three-axis attitude angles of the measuring coil 1 and the third offset coil 4 are ($\varphi_R$, $\varphi_P$, $\varphi_Y$), the three-axis attitude angle of the fourth offset coil 5 is ($-\varphi_R$, $\varphi_P$, $\varphi_Y$).

1, the measuring coil 1 and the offset coil pairs may be square or any other axisymmetric coils; 2, the relative position relationship between the measuring coil 1 and the offset coil pairs may be changed; and 3, the processing method may be adapted to any combination of the measuring coil and offset coils meeting the conditions.

Figure 4:
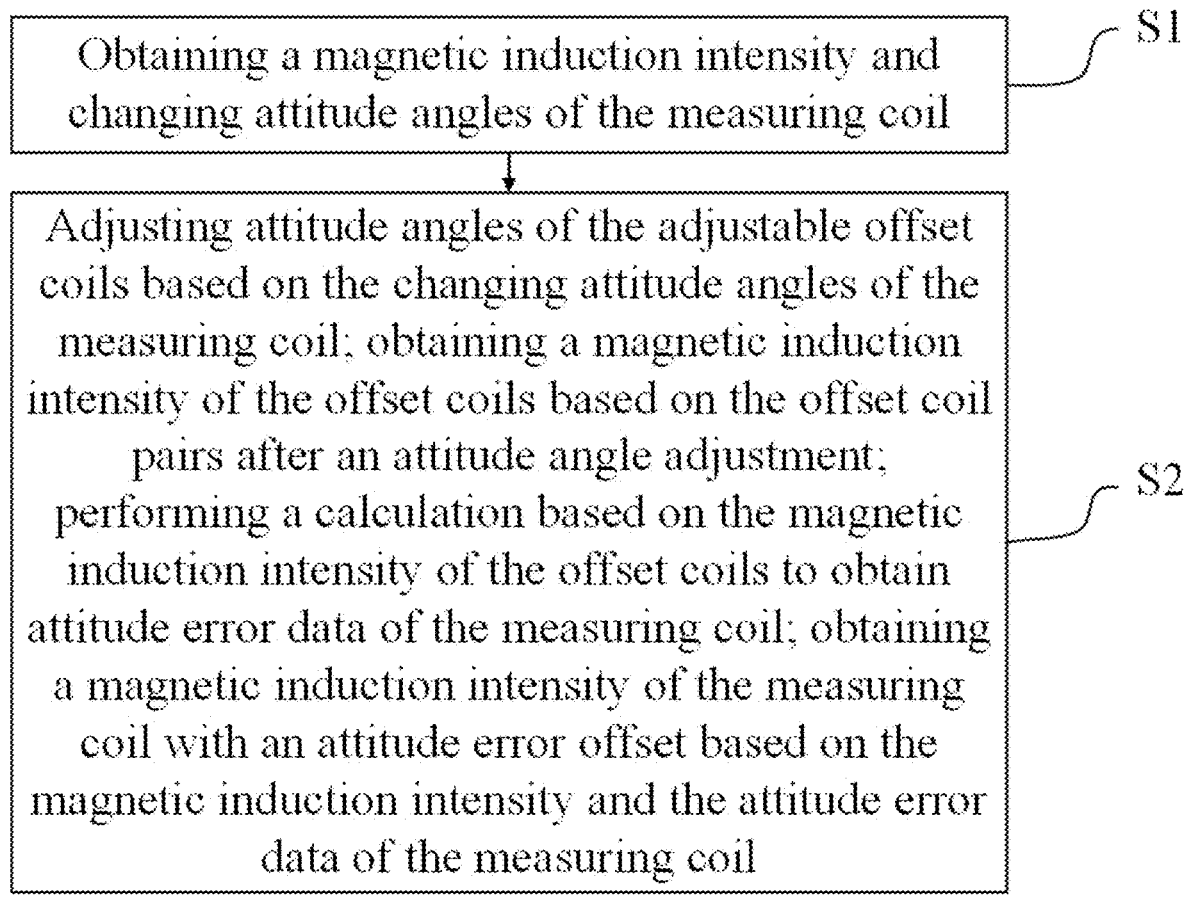
FIG. 4 is a flow chart of a processing method of the device for offsetting the attitude error of the semi-airborne electromagnetic system provided by the present disclosure.

As shown in FIG. 4, a processing method for offsetting an attitude error of a semi-airborne electromagnetic system is also provided, and the processing method includes following steps:

as shown in FIG. 1, based on the above device, the processing method is specifically as follows: an initial coordinate system oxyz is established, and the coordinate system also changes after the attitude changes, and the changed coordinate system is defined as a rotating coordinate system ox'y'z'. The coordinate origin of the initial coordinate system is located in the center of the measuring coil 1, and the x, y and z axes are completely parallel to x, y and z axes of an emission source coordinate system. When the measuring coil 1 produces an attitude change during movement, relative to the initial coordinate system, the changed attitude angles of the measuring coil 1 obtained by the three-axis angle sensor are respectively $\varphi_R$, $\varphi_P$ and $\varphi_Y$. The attitude change of the measuring coil 1 is decomposed into three parts: (1) the yaw angle $\varphi_Y$ generated by the measuring coil 1 around the z axis; (2) the pitch angle $\varphi_P$ generated by the measuring coil 1 around the y axis; and (3) the roll angle $\varphi_R$ generated by the measuring coil 1 around the x axis. Accordingly, the coordinate system rotation matrices are as follows:

$$R_Y = \begin{bmatrix} \cos\varphi_Y & \sin\varphi_Y & 0 \\ -\sin\varphi_Y & \cos\varphi_Y & 0 \\ 0 & 0 & 1 \end{bmatrix} \quad (1)$$

$$R_P = \begin{bmatrix} \cos\varphi_P & 0 & -\sin\varphi_P \\ 0 & 1 & 0 \\ \sin\varphi_P & 0 & \cos\varphi_P \end{bmatrix} \quad (2)$$

$$R_R = \begin{bmatrix} 1 & 0 & 0 \\ 0 & \cos\varphi_R & \sin\varphi_R \\ 0 & -\sin\varphi_R & \cos\varphi_R \end{bmatrix} \quad (3)$$

then a whole rotation matrix $R=R_R R_P R_Y$ is obtained, that is:

$$R = \begin{bmatrix} c\varphi_P c\varphi_Y & c\varphi_P s\varphi_Y & -s\varphi_P \\ c\varphi_Y s\varphi_P s\varphi_R - s\varphi_Y c\varphi_R & s\varphi_Y s\varphi_P s\varphi_R + c\varphi_Y c\varphi_R & c\varphi_P s\varphi_R \\ c\varphi_Y s\varphi_P c\varphi_R + s\varphi_Y s\varphi_R & s\varphi_Y s\varphi_P c\varphi_R - c\varphi_Y s\varphi_R & c\varphi_P c\varphi_R \end{bmatrix} \quad (4)$$

where s represents an abbreviation of the sine function sin, and c represents an abbreviation of the cosine function cos, respectively.

A measured magnetic induction intensity $B_r$ of the measuring coil 1 after the attitude change:

$B_r = R \cdot [B_x, B_y, B_z]^T \cdot [0,0,1]^T = B_x(c\varphi_Y s\varphi_P c\varphi_R + s\varphi_Y s\varphi_R) + B_y(s\varphi_Y s\varphi_P c\varphi_R - c\varphi_Y s\varphi_R) + B_z c\varphi_R c\varphi_P = \Delta B_r + B_z c\varphi_R c\varphi_P$ It may be seen that after removing the attitude error introduced by the horizontal magnetic field component, the measured magnetic induction intensity only contains the part related to the measured vertical magnetic induction intensity, and the attitude factor is the cosine of the roll and pitch angles. When the two angles are small, the attitude influence may be basically ignored. Therefore, the disclosure aims to offset the attitude error introduced by the horizontal magnetic field component.

Figure 2:
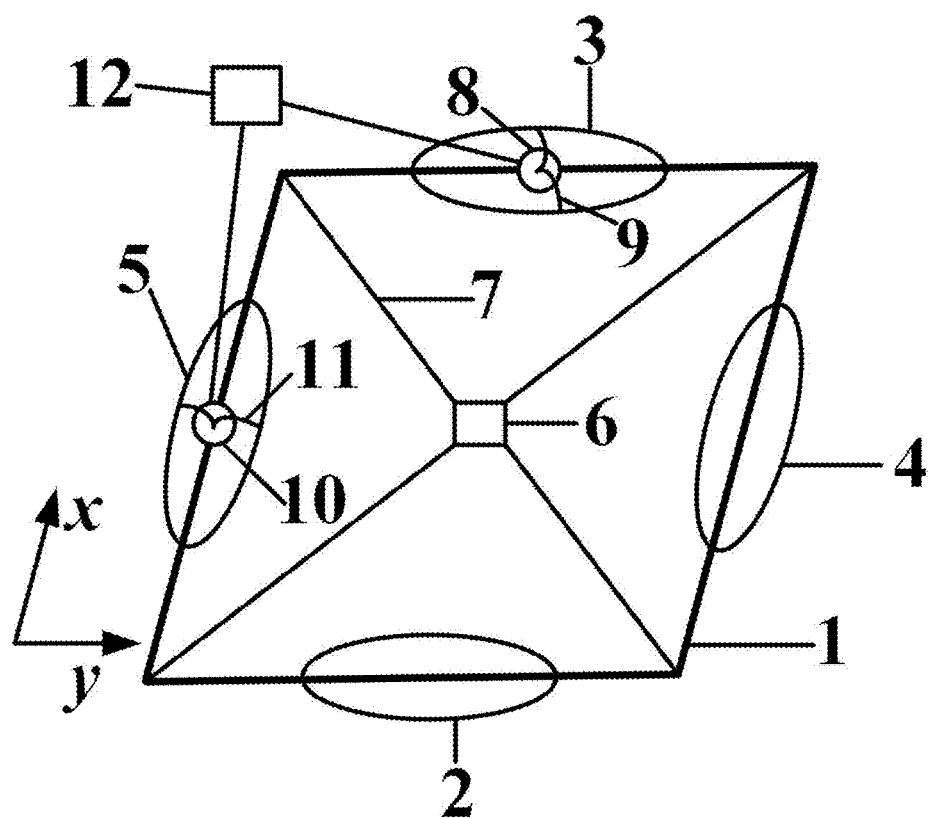
FIG. 2 is a schematic diagram of a combination between a measuring coil and offset coils provided by the embodiment of the present disclosure.

In the disclosure, the measuring coil 1 is a square coil, and the offset coils are two attitude error offset coil pairs, and the position distribution relationship is shown in FIG. 2.

Taking the offset coil pair in the x direction as an example, the roll angles and the yaw angles of the two offset coils are completely consistent with the roll angles and the yaw angles of the measuring coil, where the pitch angle of the second offset coil 3 has a same absolute value with the pitch angle of the measuring coil 1 and the pitch angle of the first offset coil 2, but has an opposite directions with the pitch angle of the measuring coil 1 and the pitch angle of the first offset coil 2, that is, the three-axis attitude angle of the first offset coil 2 is consistent with the three-axis attitude angle of the measuring coil 1, as ($\varphi_R$, $\varphi_P$, $\varphi_Y$), and the three-axis attitude angle of the second offset coil 3 is ($\varphi_R$, $-\varphi_P$, $\varphi_Y$), then the measured magnetic induction intensities of the first offset coil 2 and the second offset coil 3 are respectively:

$$B_{r1}=B_x(c\varphi_Y s\varphi_P c\varphi_R + s\varphi_Y s\varphi_R) + B_y(s\varphi_Y s\varphi_P c\varphi_R - c\varphi_Y s\varphi_R) + B_z c\varphi_R c\varphi_P$$

$$B_{r2}=B_x(-c\varphi_Y s\varphi_P c\varphi_R + s\varphi_Y s\varphi_R) + B_y(-s\varphi_Y s\varphi_P c\varphi_R - c\varphi_Y s\varphi_R) + B_z c\varphi_R c\varphi_P$$

The offset coil pair in the y direction is similar, the pitch angles and the yaw angles of the two coils are completely consistent with the pitch angles and the yaw angles of the measuring coil 1, where the roll angles of the two coils have a same absolute value with the roll angle of the measuring coil, but the directions of the roll angles of the two coils are opposite, that is, the three-axis attitude angle of the third offset coil 4 is consistent with the three-axis attitude angle of the measuring coil 1, as ($\varphi_R$, $\varphi_P$, $\varphi_Y$), and the three-axis attitude angle of the fourth offset coil 5 is ($-\varphi_R$, $\varphi_P$, $\varphi_Y$), then the measured magnetic induction intensities of the first offset coil 4 and the second offset coil 5 are respectively:

$$B_{r3}=B_x(c\varphi_Y s\varphi_P c\varphi_R + s\varphi_Y s\varphi_R) + B_y(s\varphi_Y s\varphi_P c\varphi_R - c\varphi_Y s\varphi_R) + B_z c\varphi_R c\varphi_P$$

$$B_{r4}=B_x(c\varphi_Y s\varphi_P c\varphi_R + s\varphi_Y s\varphi_R) + B_y(s\varphi_Y s\varphi_P c\varphi_R + c\varphi_Y s\varphi_R) + B_z c\varphi_R c\varphi_P.$$

It may be seen that a deviation of the measured magnetic induction intensity of the offset coil pair in the x direction is:

$$\Delta B_{r1}=B_{r1}-B_{r2}=2B_x c\varphi_Y s\varphi_P c\varphi_R + 2B_y s\varphi_Y s\varphi_P c\varphi_R = 2(B_x c\varphi_Y s\varphi_P c\varphi_R + B_y s\varphi_Y s\varphi_P c\varphi_R)$$

and a deviation of the measured magnetic induction intensity of the offset coil pair in the y direction is:

$$\Delta B_{r2}=B_{r3}-B_{r4}=2B_x s\varphi_Y s\varphi_R - 2B_y c\varphi_Y s\varphi_R = 2(B_x s\varphi_Y s\varphi_R - B_y c\varphi_Y s\varphi_R).$$

The attitude error caused by the horizontal magnetic field component in the measuring coil 1 has a following relationship with the above two deviations:

$$\Delta B_r = \frac{\Delta B_{r1} + \Delta B_{r2}}{2};$$

the magnetic induction intensity of the measuring coil after offsetting the above attitude errors is $B_c=B_z c\varphi_R c\varphi_P$, closer to the real value of the measured vertical magnetic induction intensity. Therefore, two offset coil pairs may be used to measure and calculate the attitude error caused by the horizontal magnetic field component in the measuring coil 1, and then offset the attitude error, so as to improve the accuracy of the measured vertical magnetic induction intensity.

Figure 3A:
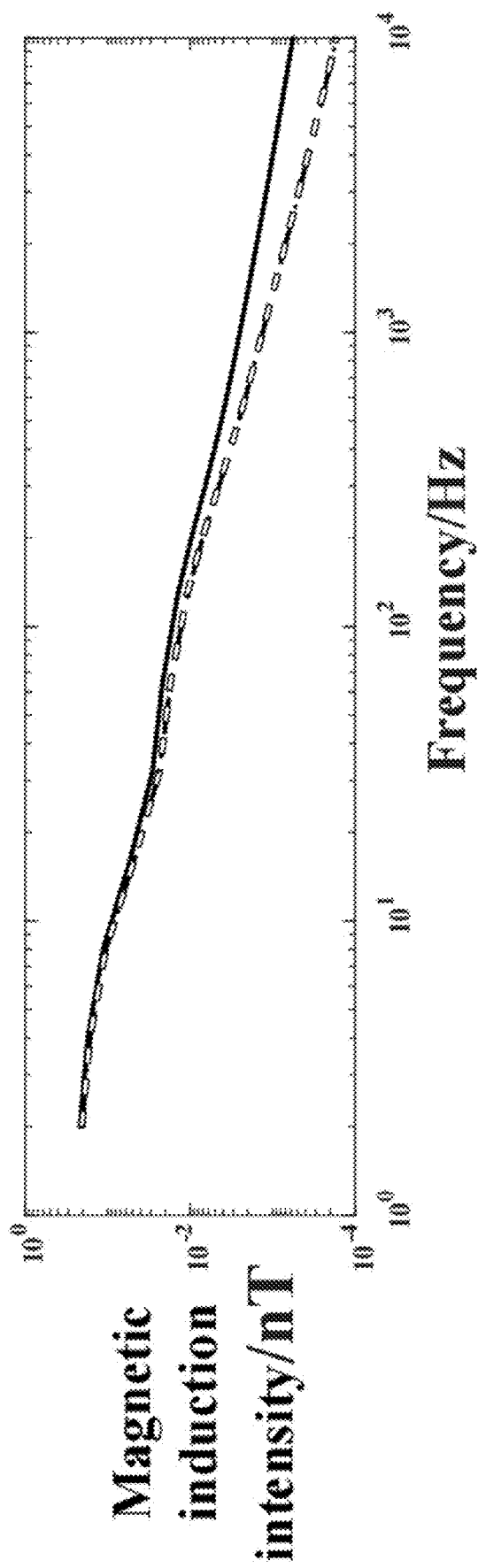
FIG. 3A shows a comparison between measured magnetic induction intensities before and after the attitude error is offset and a real magnetic induction intensity.
Figure 3B:
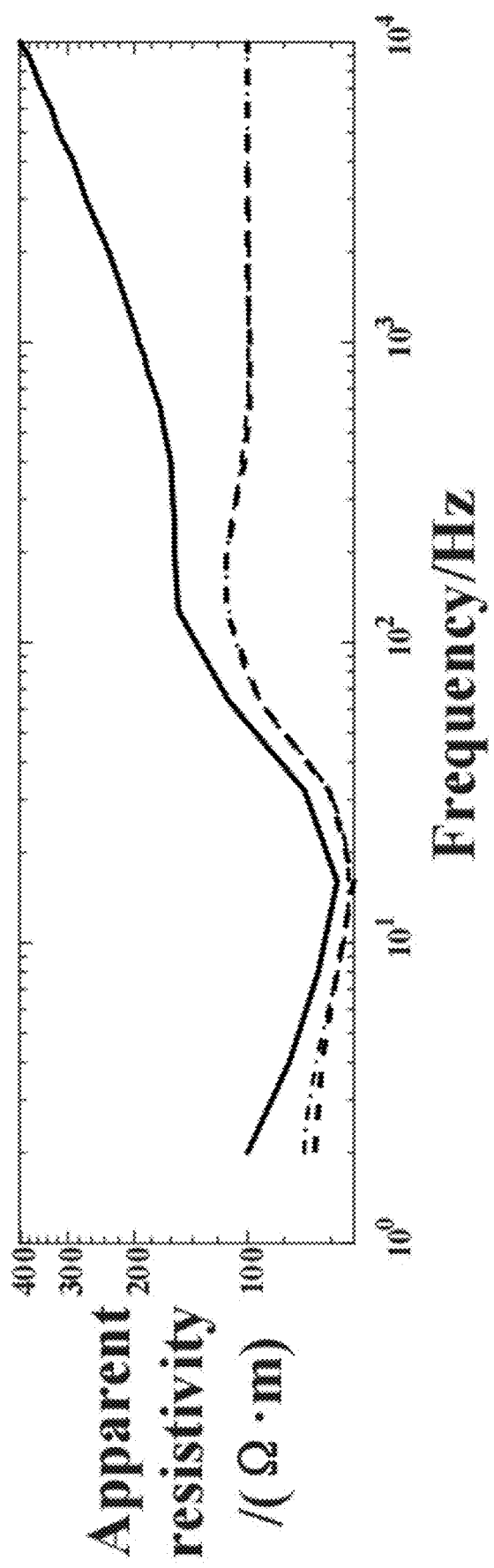
FIG. 3B shows a comparison between measured apparent resistivities before and after the attitude error is offset and a real apparent resistivity.
Figure 3C:
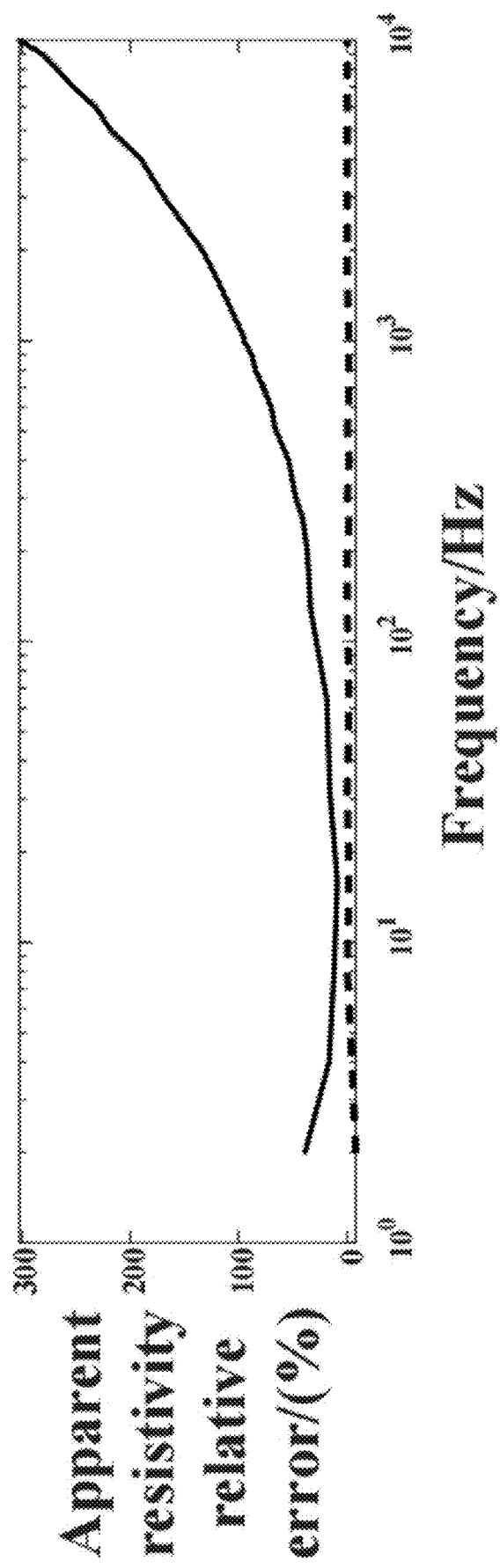
FIG. 3C shows a comparison of relative errors of measured apparent resistivities before and after the attitude error is offset.

According to the device and the processing method disclosed by the disclosure, the attitude error caused by the horizontal magnetic field component introduced by the coil attitude change in the measuring coil 1 is measured and calculated through the offset coil pairs, so that the influence of the same-frequency attitude error being difficult to deal with by the conventional method may be fully offset, and further the signal-to-noise ratio of the system is improved, the detection accuracy of the system is improved, and the detection depth and range are expanded. The effective effect simulation results are shown in FIG. 3A, FIG. 3B, and FIG. 3C; in the FIG. 3A: the black solid line in the FIG. 3A represents the measured magnetic induction intensity of the measuring coil after attitude deflection, the white dotted line with black edges in the FIG. 3A represents the magnetic induction intensity after the attitude error is offset, and the black dot dash line in the FIG. 3A represents the real magnetic induction intensity of the measuring coil without attitude deflection; in the FIG. 3B: the black solid line in the FIG. 3B represents the apparent resistivity of the measuring coil after attitude deflection, the black dotted line in the FIG. 3B represents the apparent resistivity after the attitude error is offset, and the black dot dash line in the FIG. 3B represents the real apparent resistivity diagram of the measuring coil without attitude deflection; in the FIG. 3C: the black solid line in the FIG. 3C represents the relative error between the apparent resistivity of the measuring coil after attitude deflection and the real apparent resistivity of the measuring coil, and the black dotted line in the FIG. 3C represents the relative error between the apparent resistivity after the attitude error is offset and the real apparent resistivity.

From the simulation results, it may be seen that the measured magnetic induction intensity is far from the real magnetic induction intensity due to the attitude error introduced after the attitude deflection of the measuring coil 1, and the corresponding apparent resistivity calculation result is far from the real value, with the maximum relative error of 300%. After the attitude error is offset by the device and method provided by the disclosure, the magnetic induction intensity and the apparent resistivity are basically consistent with the real values, and the relative error of apparent resistivity is less than 1%. Therefore, the device and the processing method for offsetting the attitude error of the semi-airborne electromagnetic system provided by the disclosure may effectively offset the attitude error, obtain high-quality data and improve the measurement accuracy of the system.

The basic principle, main features and advantages of the present disclosure have been shown and described above. It should be understood by those skilled in the art that the present disclosure is not limited by the above-mentioned embodiments, and what is described in the above-mentioned embodiment and descriptions only illustrates the principles of the present disclosure. Without departing from the spirit and scope of the present disclosure, there are various changes and improvements in the present disclosure, and these changes and improvements shall fall within the scope of the claimed disclosure. The scope of the present disclosure is defined by the appended claim and their equivalents.

What is claimed is:

1. A device for offsetting an attitude error of a semi-airborne electromagnetic system, comprising:
   a measuring coil, offset coils, a logic control unit and attitude adjustment devices;
   wherein the offset coils are arranged in different directions of the measuring coil, and the offset coils symmetrically arranged in same directions are offset coil pairs, wherein the offset coil pair consists of an adjustable offset coil and a fixed offset coil, the attitude adjusting devices are connected with the adjustable offset coils and sleeved on the measuring coil with the adjustable offset coils, and the fixed offset coils are fixed on the measuring coil; and the logic control unit is connected with the attitude adjustment devices and is used for controlling the attitude adjustment devices to adjust attitudes of the adjustable offset coils.

2. The device according to claim 1, wherein
the attitude adjustment devices adopt micro motors, wherein the micro motors are insulated and fixed on the measuring coil and arranged at centers of the adjustable offset coils.

3. The device according to claim 1, wherein
the measuring coil and the offset coils are axisymmetric coils.

4. A processing method of the device for offsetting the attitude error of the semi-airborne electromagnetic system according to claim 1, comprising:
obtaining a magnetic induction intensity and changing attitude angles of the measuring coil; and
adjusting attitude angles of the adjustable offset coils based on the changing attitude angles of the measuring coil; obtaining a magnetic induction intensity of the offset coils based on the offset coil pairs after an attitude angle adjustment; performing a calculation based on the magnetic induction intensity of the offset coils to obtain attitude error data of the measuring coil; obtaining a magnetic induction intensity of the measuring coil with an attitude error offset based on the magnetic induction intensity and the attitude error data of the measuring coil.

5. The method according to claim 4, wherein
a process of obtaining the changing attitude angles of the measuring coil comprises:
constructing an initial coordinate system when the measuring coil is completely horizontal; in an attitude changing process of the measuring coil, constructing a rotating coordinate system in real time, and calculating the changing attitude angles of the measuring coil in different directions according to the initial coordinate system and the rotating coordinate system, wherein the changing attitude angles of the measuring coil comprise a yaw angle, a pitch angle and a roll angle.

6. The method according to claim 4, wherein
the obtained magnetic induction intensity $B_r$ of the measuring coil is:

$$B_r = R \cdot [B_x, B_y, B_z]^T \cdot [0,0,1]^T = B_x(c\varphi_Y s\varphi_P c\varphi_R + s\varphi_Y s\varphi_R) + B_y(s\varphi_Y s\varphi_P c\varphi_R - c\varphi_Y s\varphi_R) + B_z c\varphi_R c\varphi_P = \Delta B_r + B_z c\varphi_R c\varphi_P$$

wherein R represents an integral rotation matrix, $B_x$ represents a real magnetic induction intensity in an x direction, $B_y$ represents a real magnetic induction intensity in a y direction, $B_z$ represents a real magnetic induction intensity in a z direction, c represents a cosine function cos, s represents a sine function sin, $\varphi_Y$ represents the yaw angle; $\varphi_P$ represents the pitch angle; $\varphi_R$ represents the roll angle and $\Delta B_r$ represents the attitude error data.

7. The method according to claim 4, wherein
a process of adjusting the attitude angles of the adjustable offset coils comprises:
adjusting the attitude angles of the offset coils based on the changing attitude angles of the measuring coil, wherein when an orientation of the offset coil pair is in the x direction, adjusting the pitch angle of the adjustable offset coil by the attitude adjusting device, and in the adjustment process, the pitch angle of the adjustable offset coil and the pitch angle of the measuring coil have same absolute values and opposite directions, the pitch angle of the fixed offset coil and the pitch angle of the measuring coil have same absolute values and same directions; and when the orientation of the offset coil pair is in the y direction, adjusting the roll angle of the adjustable offset coil, and in the adjustment process, the roll angle of the adjustable offset coil and the roll angle of the measuring coil have same absolute values and opposite directions, the roll angle of the fixed offset coil and the roll angle of the measuring coil have same absolute values and same directions.

8. The method according to claim 4, wherein
a process of calculating the attitude error data $\Delta B_r$ is:

$$\Delta B_r = \frac{\Delta B_{r1} + \Delta B_{r2}}{2};$$

wherein $\Delta B_{r1}$ represents a measured magnetic induction intensity deviation of the offset coil pair in the x direction, and $\Delta B_{r2}$ represents a measured magnetic induction intensity deviation of the offset coil pair in the y direction.

* * * * *